United States Patent
Fushie et al.

(10) Patent No.: US 10,373,896 B2
(45) Date of Patent: Aug. 6, 2019

(54) SEMICONDUCTOR MODULE AND DRIVE DEVICE EQUIPPED WITH SEMICONDUCTOR MODULE

(71) Applicant: Mitsubishi Electric Corporation, Tokyo (JP)

(72) Inventors: Shunsuke Fushie, Tokyo (JP); Yu Kawano, Tokyo (JP); Yoshihito Asao, Tokyo (JP); Akihiko Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/117,238

(22) PCT Filed: Mar. 28, 2014

(86) PCT No.: PCT/JP2014/059253
§ 371 (c)(1),
(2) Date: Aug. 8, 2016

(87) PCT Pub. No.: WO2015/145752
PCT Pub. Date: Oct. 1, 2015

(65) Prior Publication Data
US 2016/0351480 A1    Dec. 1, 2016

(51) Int. Cl.
*H01L 23/495* (2006.01)
*H01L 23/498* (2006.01)
(Continued)

(52) U.S. Cl.
CPC .... *H01L 23/49568* (2013.01); *H01L 23/3107* (2013.01); *H01L 23/3121* (2013.01);
(Continued)

(58) Field of Classification Search
CPC ............... H01L 23/495–23/49596; H01L 23/31–23/3192; H01L 23/49568;
(Continued)

(56) References Cited

U.S. PATENT DOCUMENTS

| 5,440,169 A | 8/1995 | Tomita et al. |
| 5,767,573 A * | 6/1998 | Noda ............... H01L 23/24 |
| | | 257/675 |

(Continued)

FOREIGN PATENT DOCUMENTS

| JP | 5-243476 A | 9/1993 |
| JP | 6-209054 A | 7/1994 |

(Continued)

OTHER PUBLICATIONS

Communication dated Mar. 14, 2017 from the Japanese Patent Office in counterpart application No. 2016-509844.

(Continued)

*Primary Examiner* — Peniel M Gumedzoe
(74) *Attorney, Agent, or Firm* — Sughrue Mion, PLLC; Richard C. Turner

(57) ABSTRACT

Provided is a semiconductor module having an integrated insulating sheet structure, wherein detachment of the insulating sheet can be suppressed and improved reliability of the semiconductor module is achieved, by adopting a structure in which at least one location of the insulating sheet is sunken inside a mold, and a sealing resin body and the insulating sheet of the semiconductor module form a protrusion.

10 Claims, 8 Drawing Sheets

(51) Int. Cl.
*H01L 23/42* (2006.01)
*H01L 23/31* (2006.01)
*H01L 23/36* (2006.01)

(52) U.S. Cl.
CPC .............. *H01L 23/36* (2013.01); *H01L 23/42* (2013.01); *H01L 23/49524* (2013.01); *H01L 23/49558* (2013.01); *H01L 23/49575* (2013.01); *H01L 23/49861* (2013.01); *H01L 23/4952* (2013.01); *H01L 2224/48091* (2013.01); *H01L 2924/181* (2013.01)

(58) Field of Classification Search
CPC ......... H01L 23/49524; H01L 23/49558; H01L 23/49575; H01L 23/49861; H01L 23/4952; H01L 2224/48091; H01L 2924/181
See application file for complete search history.

(56) References Cited

U.S. PATENT DOCUMENTS

| | | | | |
|---|---|---|---|---|
| 6,144,571 A * | 11/2000 | Sasaki | .................. | H01L 25/162 257/687 |
| 6,713,864 B1 * | 3/2004 | Huang | ................ | H01L 23/4334 257/692 |
| 7,405,467 B2 * | 7/2008 | Liu | .................... | H01L 23/4334 257/672 |
| 7,808,100 B2 * | 10/2010 | Bayerer | ................. | H01L 24/06 174/261 |
| 8,514,579 B2 * | 8/2013 | Stolze | ................. | H01L 23/3121 361/728 |
| 2007/0240899 A1 | 10/2007 | Sakamoto | | |
| 2010/0133667 A1 | 6/2010 | Oka et al. | | |
| 2010/0284155 A1 | 11/2010 | Stolze et al. | | |
| 2014/0353814 A1 * | 12/2014 | Sakamoto | ........... | H01L 23/3107 257/712 |
| 2016/0079143 A1 * | 3/2016 | Sakamoto | ............... | H01L 23/16 257/712 |

FOREIGN PATENT DOCUMENTS

| | | |
|---|---|---|
| JP | 10-125826 A | 5/1998 |
| JP | 10-261744 A | 9/1998 |
| JP | 2002-368165 A | 12/2002 |
| JP | 2005-353805 A | 12/2005 |
| JP | 2011-134949 A | 7/2011 |
| JP | 2011-159743 A | 8/2011 |
| JP | 5279632 B2 | 9/2013 |
| WO | 2013/124988 A1 | 8/2013 |

OTHER PUBLICATIONS

International Search Report of PCT/JP2014/059253, dated Dec. 22, 2014. [PCT/ISA/210].
Preliminary Notice of Reasons for Rejection, dated Nov. 29, 2016, JP Appln No. 2016-509844.
Extended European Search Report dated Nov. 10, 2017 issued by the European Patent Office in counterpart application No. 14887349.0.

* cited by examiner

US 10,373,896 B2

SEMICONDUCTOR MODULE AND DRIVE DEVICE EQUIPPED WITH SEMICONDUCTOR MODULE

CROSS REFERENCE TO RELATED APPLICATIONS

This application is a National Stage of International Application No. PCT/JP2014/059253 filed Mar. 28, 2014, the contents of all of which are incorporated herein by reference in their entirety.

TECHNICAL FIELD

The present invention relates to a semiconductor module for driving an electric motor, and a drive device equipped with a semiconductor module.

BACKGROUND ART

In recent years, semiconductor packages having high insulating properties and good heat radiating properties have become required in semiconductor modules that are provided with a power semiconductor element, such as an IGBT (Insulated Gate Bipolar Transistor) and power MOSFET. One means for achieving a semiconductor package of this kind is a semiconductor module having an integrated high-thermal-conductivity insulating sheet structure (see, for example, PTLs 1 and 2).

CITATION LIST

Patent Literature

[PTL 1]
Japanese Patent Application Publication No. 2005-353805
[PTL 2]
Japanese Patent No. 5279632

SUMMARY OF INVENTION

Technical Problem

However, the prior art involves the following problems. In the prior art disclosed in PTL 1, there is a high possibility of detachment of the insulating sheet, and furthermore, in following steps, the burr of the insulating sheet or sealing resin must be eliminated. Furthermore, the prior art disclosed in PTL 2 involves an additional step for bending the insulating sheet, and presents an obstacle to compactification.

The present invention was devised in order to solve the problems described above, an object thereof being to obtain a semiconductor module and a drive device equipped with a semiconductor module, whereby detachment of the insulating sheet can be suppressed.

Solution to Problem

The semiconductor module relating to the present invention includes a lead frame which is formed of a plurality of terminals and on which electronic components are mounted; an insulating sheet arranged in parallel with the lead frame on a rear surface side of the lead frame with respect to a surface where the electronic components are mounted; and a resin sealing body which seals the lead frame, the electronic components and the insulating sheet; wherein at least a portion of a peripheral portion of the insulating sheet on a rear surface side with respect to a surface in contact with the lead frame is covered by the resin sealing body, and a central portion of the insulating sheet corresponding to a portion other than the peripheral portion is exposed as a region that is not sealed by the resin sealing body.

Furthermore, a drive device equipped with a semiconductor module according to the present invention includes:
a semiconductor module according to the present invention, and a heat sink on which the semiconductor module is mounted, the heat sink being positions so as to contact the region that is not sealed by the resin sealing body.

Advantageous Effects of Invention

According to the present invention, by adopting a structure for a semiconductor module in which at least one location of an insulating sheet is sunken inside a mold, and a sealing resin body and an insulating sheet of the semiconductor module form a protrusion, then it is possible to obtain a semiconductor module capable of suppressing detachment of the insulating sheet, and a drive device equipped with the semiconductor module. Furthermore, the burr of the insulating sheet is disposed inside the protrusion, and therefore removal thereof in post-processing is not necessary.

DESCRIPTION OF EMBODIMENTS

Figure 1:
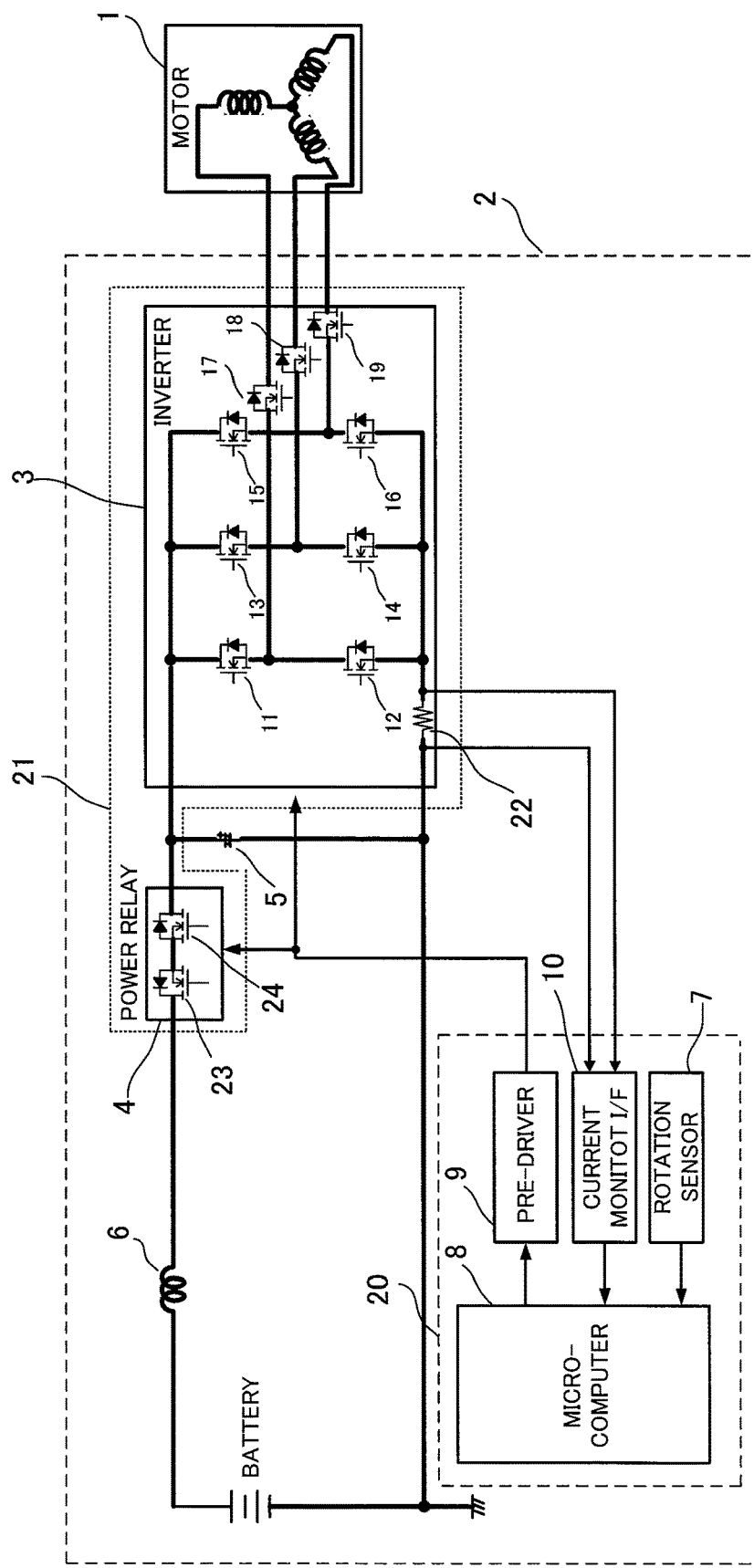
FIG. 1 is a general circuit diagram showing a power steering device mounted in a vehicle, as an example of a device to which the semiconductor module according to a first embodiment of the present invention is applied.

A preferred embodiment of a semiconductor module according to the present invention and a drive device equipped with the semiconductor module will be described below with reference to the drawings. Parts which are the same or equivalent in the drawings are labelled with the same reference numerals.

First Embodiment

FIG. 1 is a general circuit diagram showing a power steering device mounted in a vehicle, as an example of a device to which the semiconductor module according to the first embodiment of the present invention is applied. This device is constituted by a motor 1 and a control unit 2, which are both integrated into a single body.

The control unit 2 is constituted by a control circuit unit 20 configured by a microcomputer 8 and peripheral circuits, and a power circuit unit 3 provided with a power relay 4 and an inverter which supplies electric power to a motor coil.

The control unit 2 receives input of various information from a battery, vehicle speed sensor, and torque sensor source, calculates a steering wheel assist amount by the microcomputer 8, and outputs same to the inverter 3 via a pre-driver 9. Furthermore, a rotation sensor interface which transmits a signal from the rotation sensor 7 that detects rotation of the motor 1, and a current monitor interface 10 which measures the current supplied to the motor 1, is connected to the microcomputer.

The power source unit operates by receiving power from the battery, and is configured from a choke coil 6 for controlling noise, a smoothing capacitor 5, and a relay 4 which connects and disconnects the lower line; the power source unit supplies power to the inverter 3. The inverter 3 is provided with a total of six upper/lower arm switching elements 11 to 16, in three sets corresponding to the three-phase coils of the motor 1. Moreover, switching elements 17 to 19 which serve as a relay capable of connecting and disconnecting the supply of power to the motor 1 are arranged respectively for each phase.

These switching elements (11 to 16, 17 to 19) are provided so as to correspond to each coil, and therefore are assigned the suffixes u, v and w. Furthermore, terminals Gh, Gl, Gm for controlling the switching elements are connected respectively to the microcomputer 8 via the pre-driver 9.

Moreover, there are three terminals Mm for voltage monitoring between the switching elements 11 to 16 of the upper and lower arms, and an upstream monitor terminal Sh of a shunt resistance 22 for current detection. These monitor values are transmitted to the microcomputer 8 via a current monitor interface 10. Apart from this, there are also coil terminals Mu, Mv, Mw for each phase in the motor 1.

The inverter 3 is a semiconductor module which incorporates a plurality of switching elements, and is created as a single component. This semiconductor module incorporates a plurality of switching elements, and therefore also incorporates a plurality of circuits connecting the components, and has a large number of terminals. Furthermore, the current for supplying power to the motor 1 is also large, and hence there is a need to improve heat radiating properties. Consequently, the semiconductor module is an important component in the device, from the viewpoint of scale, quality, cost, and so on.

Figure 2:
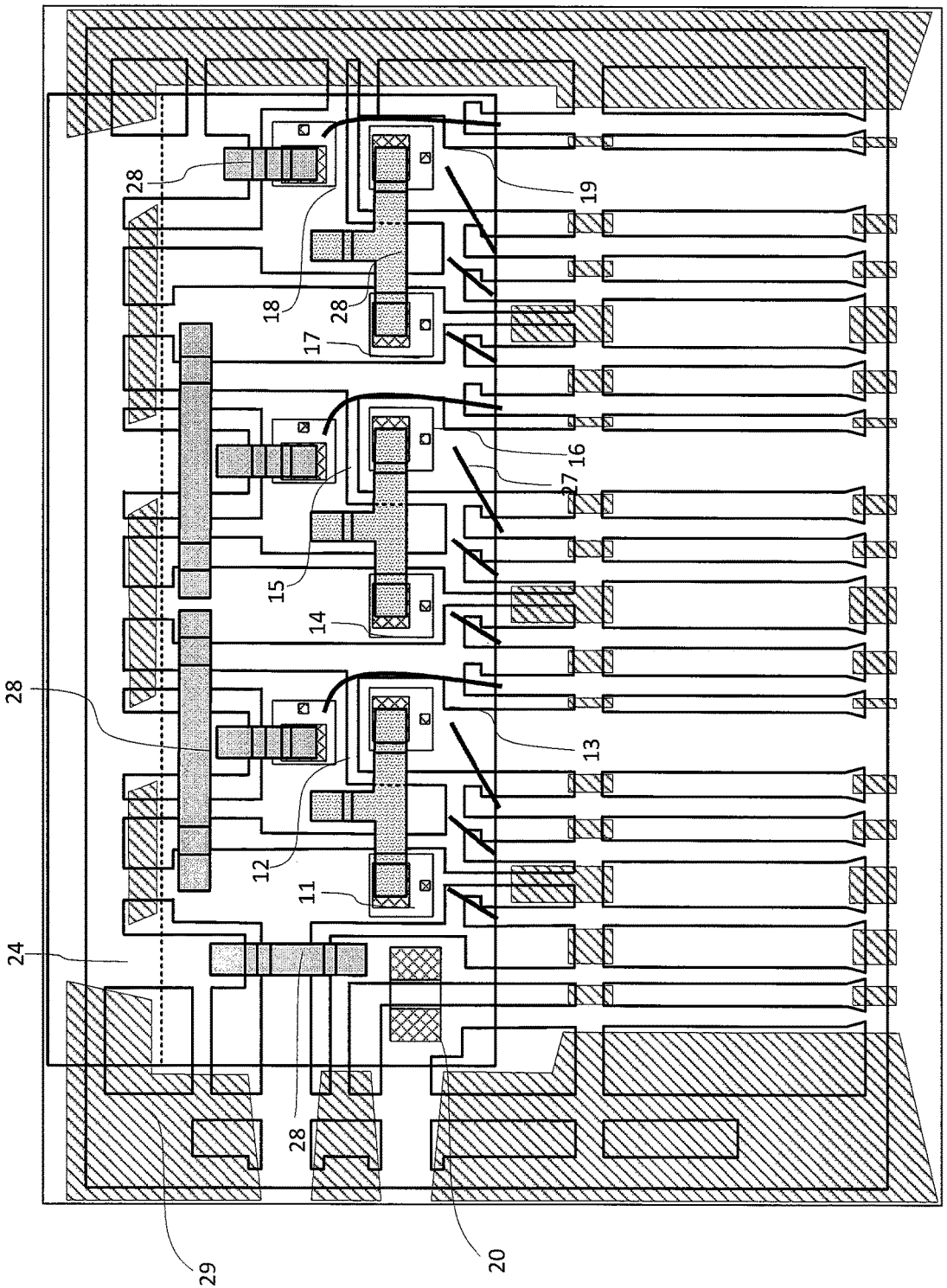
FIG. 2 is a diagram showing a transparent view of a semi-completed state of the semiconductor module according to the first embodiment of the present invention.
Figure 3:
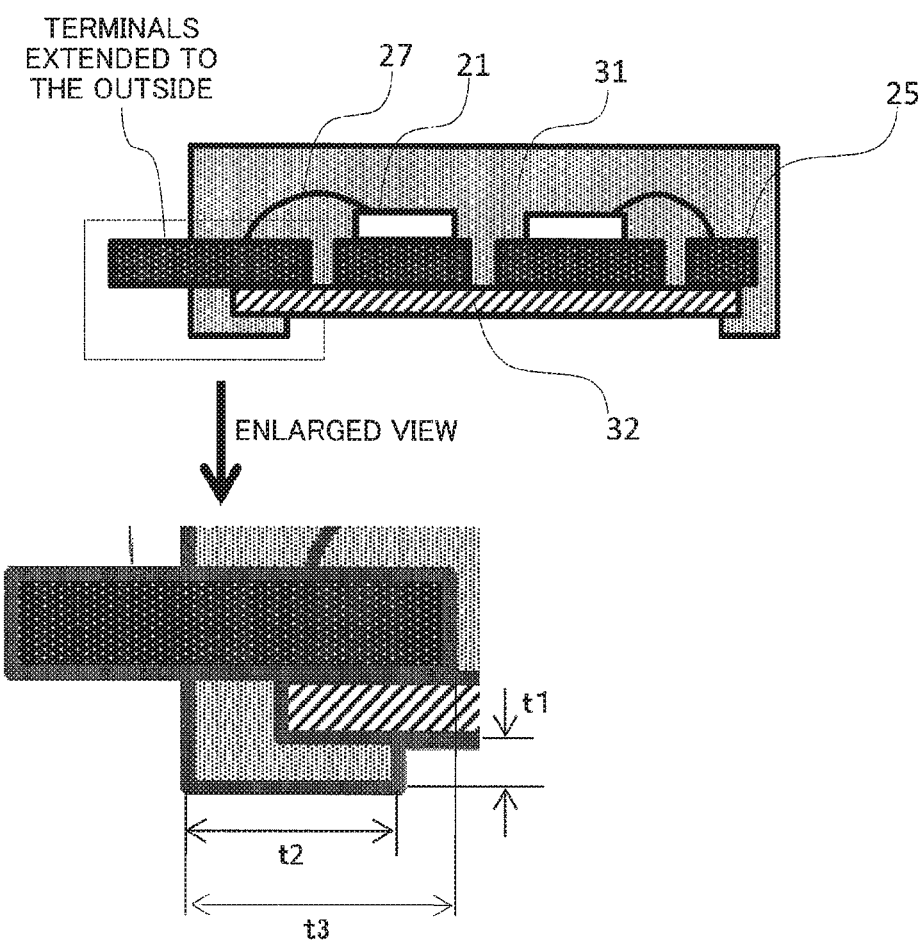
FIG. 3 is a cross-sectional diagram of the semiconductor module according to the first embodiment of the present invention.
Figure 4:
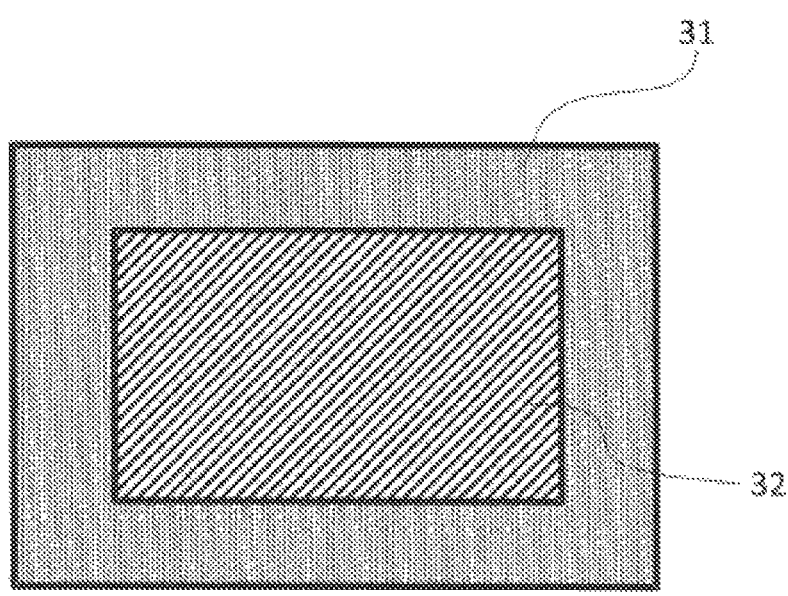
FIG. 4 is a perspective diagram of the semiconductor module according to the first embodiment of the present invention.

Next, the structure of the semiconductor module which is the main essence of the present invention will be described with reference to FIG. 2 onwards. FIG. 2 is a diagram showing a perspective view of a semi-completed state of the semiconductor module according to a first embodiment of the present invention. Furthermore, FIG. 3 is a cross-sectional diagram of the semiconductor module according to the first embodiment of the present invention. Furthermore, FIG. 4 is a perspective diagram of the semiconductor module according to the first embodiment of the present invention.

As illustrated in FIG. 3, in the semiconductor module, a lead frame 25 on which a plurality of semiconductor elements and other electronic components, and the like, are mounted is disposed on an insulating sheet 32 made of thermally-curable resin. As illustrated in FIG. 4, a structure is adopted in which the portion of the insulating sheet 32 apart from the central part thereof is molded with a sealing resin 31. The details of each unit are described below.

The lead frame 25 is manufactured from a copper or iron alloy material, by applying a pressing, etching or cutting process to a single metal sheet material, which is stretched without any overlap between respective parts thereof. The pressing, etching and cutting processes each have the merits of, respectively, high productivity, shorting turnaround, and low cost.

Three semiconductor chips, for example, U-phase FETs 11, 12 17, are respectively mounted on a die pad, and FETs are similarly provided for the V-phase and W-phase, making a total of nine FETs arranged on the die pad. As illustrated in FIG. 2, the semiconductor chips, or the lead frames 25, are connected together by beams 28 of copper or iron material, and these beams 28 span over the lead frames 25. Furthermore, a plurality of terminals protrude downwards in FIG. 2.

A thermally-curable resin, such as epoxy resin, is used for the insulating sheet 32 which is arranged on the surface of the lead frame 25 facing the side where the electronic components are to be mounted (see FIG. 3). The present invention is not limited to using epoxy resin, and it is also possible to use another well-known thermally-curable resin.

In order to suppress detachment of the sealing resin 31 which covers the insulating sheet 32, the relationship between the height t1 and the width t2 of the protrusions which are formed by the sealing resin 31 and the insulating sheet 32 is set to t2>t1 (see FIG. 3).

Furthermore, in order to suppress deformation of the insulating sheet 32, the terminals which are extended to the outside of the sealing resin 31 are configured so as to be sunken to the inside of the protrusions of the sealing resin 31 (corresponding to the relationship t3>t2 in FIG. 3). Moreover, the protrusion in the sealing resin 31 in the vicinity of the terminals which are extended to the outside has a greater width underneath the insulating sheet 32 than other portions, and thereby suppresses detachment of the sealing resin 31 (in FIG. 3, the dimension t2 of the protrusion on the left-hand side is greater than the dimension t2 of the protrusion on the right-hand side, so that a portion of resin sealing body 31 that extends inwardly beyond the edge of the insulating sheet 32 underneath the terminal on the left-hand side extends further inward than a portion of the resin sealing body 31 on the right-hand side of FIG. 3 that is not underneath the terminal).

Next, the method for manufacturing a semiconductor module according to a first embodiment will be described.

Firstly, the insulating sheet 32 is disposed inside the cavity of a molding die, and a lead frame 25 on which a semiconductor element, electronic components, and the like, have been mounted is placed on the insulating sheet 32. In this case, the insulating sheet 32 and the lead frame 25 are fixed in position by fixed or movable pins provided in the die. Furthermore, the insulating sheet 32 is arranged in such a manner that the burr and shear droop of the insulating sheet 32 are oriented away from the lead frame 25, in order to improve adhesiveness with the lead frame 25.

Moreover, the central portion of the insulating sheet 32 is in a state of direct contact with the lower die inside the cavity. Thereupon, the molding die is closed, and a sealing resin 31 is formed by filling the cavity with a thermally-curable resin, such as epoxy resin. Moreover, after the sealing resin 31 and the insulating sheet 32 have been cured, finally, the unwanted lead frame region (see the hatched area indicated by 29 in FIG. 1) is cut away, thereby completing the semiconductor module. Rather than covering all parts with sealing resin 31, it is also possible to form an outer frame, and then cover the center thereof with silicone resin.

The semiconductor module formed in this way has a structure wherein the outer peripheral portion of the insulating sheet 32 is sunken inside the sealing resin 31, and detachment of the insulating sheet 32 can be suppressed (see FIG. 3). Moreover, since the burr and droop of the insulating sheet 32 are sunken inside the sealing resin, then there is no need to remove same in post processing, thus leading to improved manufacturing efficiency. The sinking dimension is determined by taking account of the tolerance of the insulating sheet 32, and is desirably no less than two times the tolerance. Furthermore, since the sealing resin 31 has a recessed shape, then it is possible to use the resin for fixing the position. The sealing resin 31 is the outermost portion, and therefore soiling and scratches in the insulating sheet 32 can be prevented.

Figure 5:
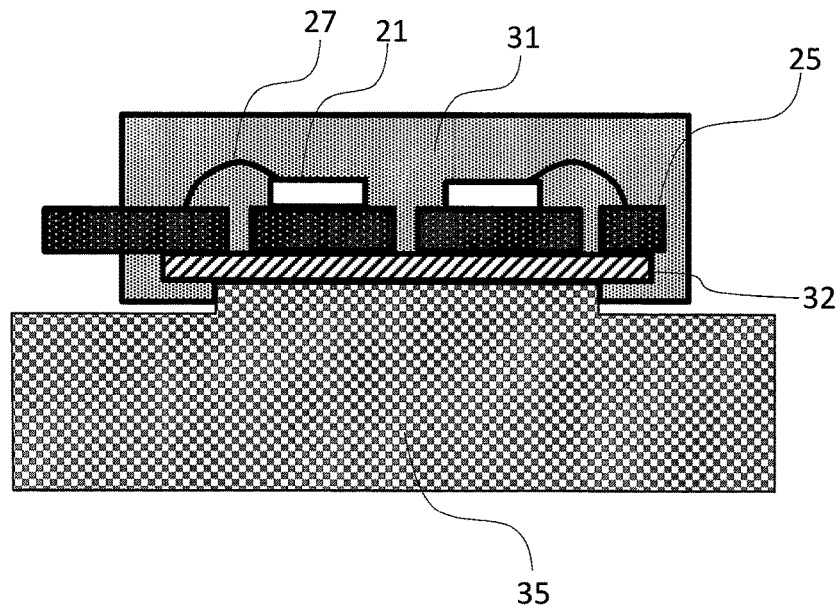
FIG. 5 is a cross-sectional diagram showing a state where the semiconductor module according to the first embodiment of the present invention has been assembled on a heat sink.

Next, the heat radiating properties of the semiconductor module according to a first embodiment will be described. FIG. 5 is a cross-sectional diagram showing a state where the semiconductor module according to the first embodiment of the present invention has been assembled on a heat sink 35. The central portion of the insulating sheet 32 of the semiconductor module according to the first embodiment is exposed, thus creating a structure which directly contacts the heat sink 35. Consequently, a structure is achieved in which the generation of heat by the power semiconductor elements is transmitted to the heat sink 35 via the lead frame 25 and the insulating sheet 32.

The droop and/or burr of the insulating sheet 32 is sunken inside the sealing resin 31. Therefore, it is possible to arrange the lead frame 25 at the shortest distance, in parallel with the heat sink 35, without tilting of the semiconductor module. As a result of this, the thermal resistance between the lead frame 25 and the heat sink 35 becomes smaller, and high heat radiating performance can be achieved.

Figure 6:
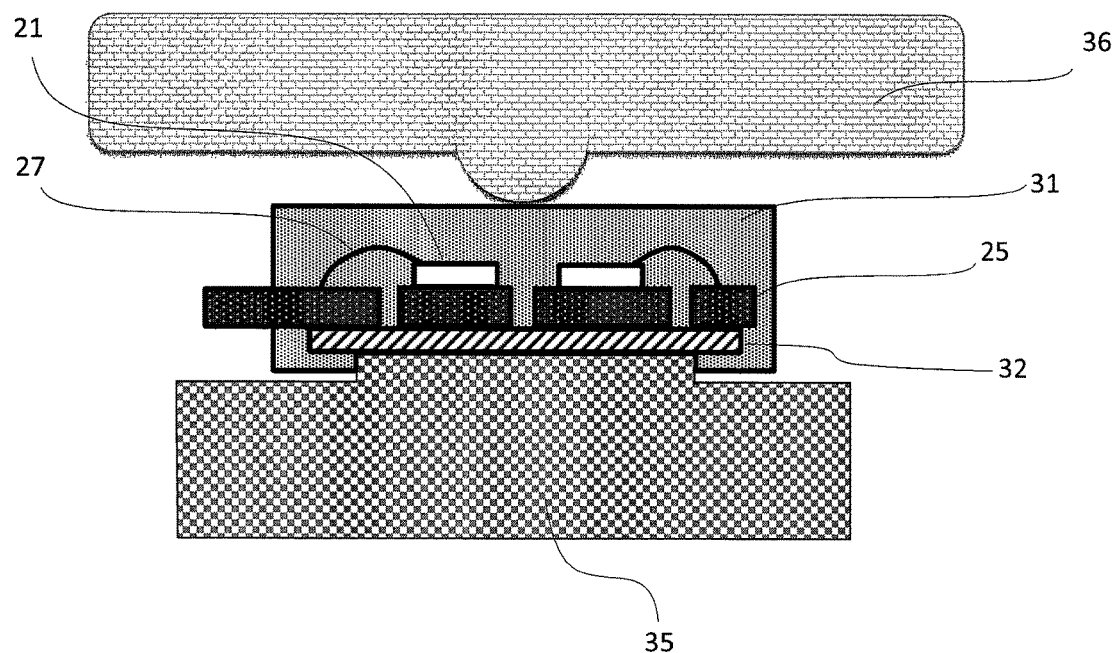
FIG. 6 is a cross-sectional diagram of the semiconductor module according to the first embodiment of the present invention.

Furthermore, FIG. 6 is a cross-sectional diagram of a semiconductor module according to a first embodiment of the present invention, and shows a configuration which reduces the thermal resistance. As illustrated in FIG. 6, by pressing the semiconductor module from above, by a frame 36, or the like, it is possible to further reduce the thermal resistance between the lead frame 25 and the heat sink 35.

Figure 7:
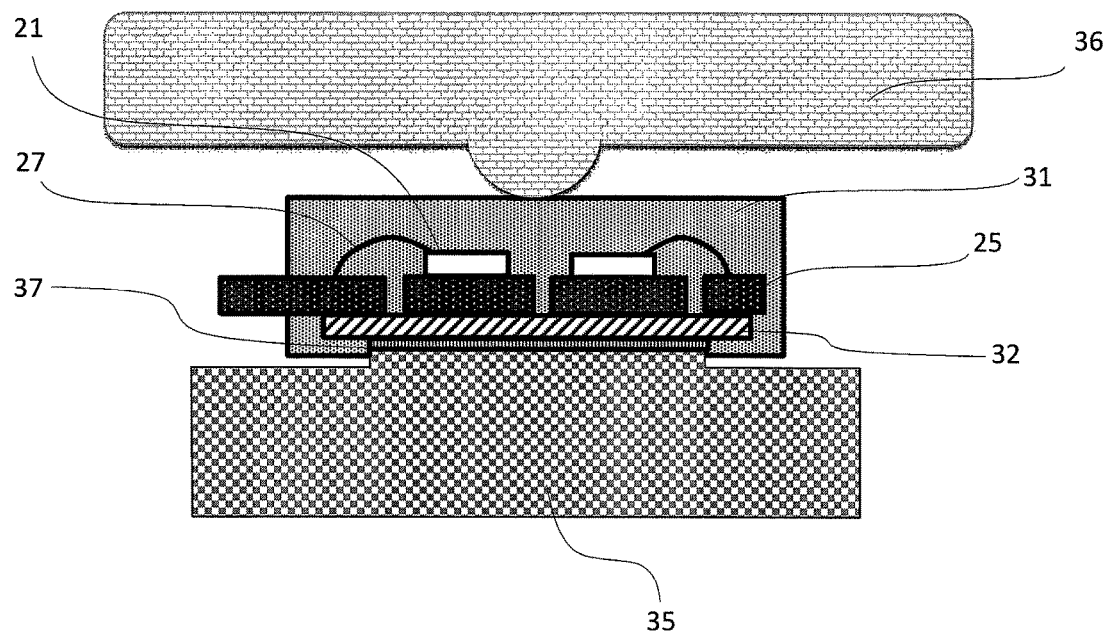
FIG. 7 is a cross-sectional diagram of the semiconductor module according to the first embodiment of the present invention.

Furthermore, FIG. 7 is a cross-sectional diagram of a semiconductor module according to a first embodiment of the present invention, and shows a further configuration which reduces the thermal resistance. As illustrated in FIG. 7, if heat-radiating grease 37 is applied between the insulating sheet 32 and the heat sink 35, then it is possible to further reduce the thermal resistance between the lead frame 25 and the heat sink 35, similarly to the configuration in FIG. 6.

As described above, according to the first embodiment, an insulating sheet is arranged in parallel with the lead frame, on the rear-side surface of the lead frame with respect to the surface where the electronic components are mounted. Moreover, by providing a sealing resin for sealing the whole perimeter of the insulating sheet, as well as the lead frame on which the electronic components are mounted (sealed resin body), a semiconductor module is formed. As a result of this, it is possible to achieve a semiconductor module capable of suppressing detachment of the insulating sheet.

Moreover, it is also possible to obtain the following beneficial effects.

As a result of adopting a structure in which burr and droop of the insulating sheet is covered inside the sealing resin, it becomes unnecessary to remove the burr in post-processing, and hence the production efficiency of the semiconductor module can be improved.

It is possible to utilize the protruding shape for fixing the position.

The sealing resin is the outermost portion, and can therefore prevent soiling and scratches in the insulating sheet.

Second Embodiment

Figure 8:
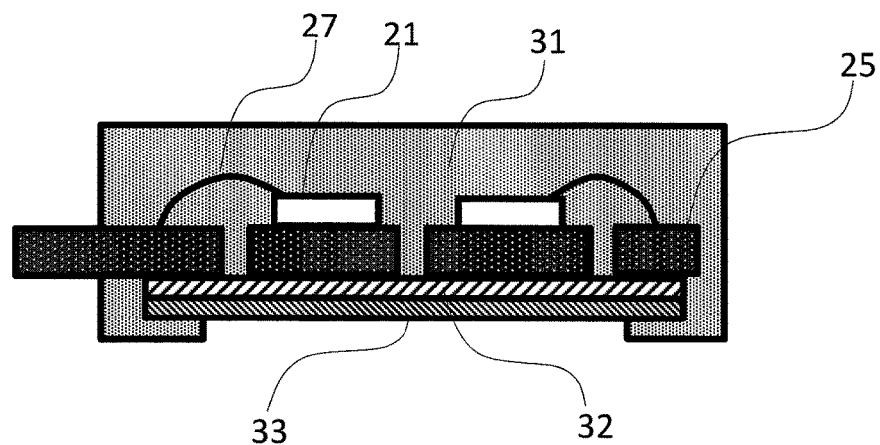
FIG. 8 is a cross-sectional diagram of the semiconductor module according to a second embodiment of the present invention.
Figure 9:
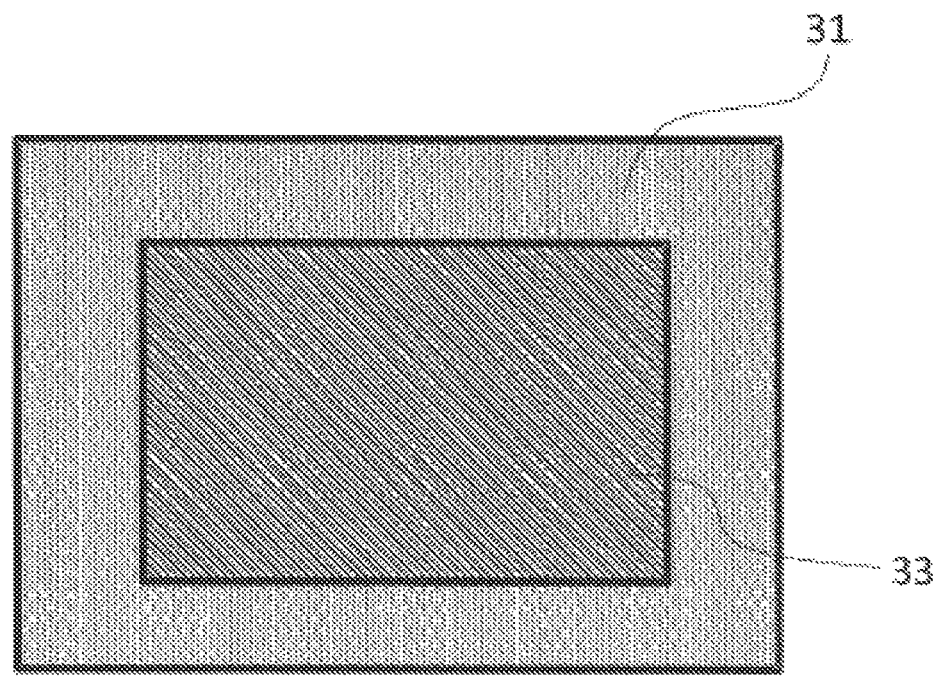
FIG. 9 is a perspective diagram of the semiconductor module according to the second embodiment of the present invention.
Figure 10:
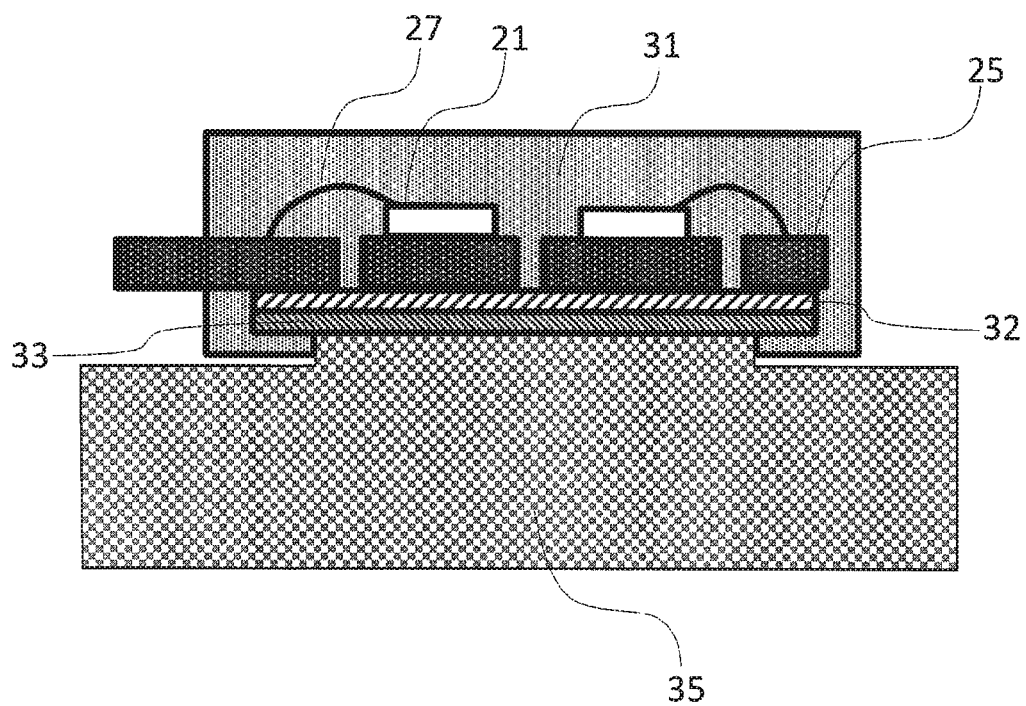
FIG. 10 is a cross-sectional diagram showing a state where the semiconductor module according to the second embodiment of the present invention has been assembled on a heat sink.

Next, a semiconductor module according to a second embodiment will be described below with reference to FIG. 8 to FIG. 10. FIG. 8 is a cross-sectional diagram of the semiconductor module according to the second embodiment of the present invention. Furthermore, FIG. 9 is a perspective diagram of the semiconductor module according to the second embodiment of the present invention. Moreover, FIG. 10 is a cross-sectional diagram showing a state where the semiconductor module according to the second embodiment of the present invention has been assembled on a heat sink 35.

The difference between the semiconductor module according to the second embodiment and the semiconductor module according to the first embodiment described above is that a metal foil 33 is provided on the surface of the insulating sheet 32 opposite to the lead frame 25, in order to protect the insulating sheet 32 from cracks and scratches, etc. Therefore, below, the description centers on the changed portion associated with this difference, and the description of the configuration that is the same as the semiconductor module described above is omitted.

In the second embodiment, a sheet in which the insulating sheet 32 and the metal foil 33 are integrated is used, with a view to operability. Similarly to the first embodiment described above, the adhesiveness between the insulating sheet 32 and the lead frame 25 is improved. Moreover, in order to avoid contact between the metal foil 33 and the lead frame 25, the sheet having the integrated insulating sheet 32 and metal foil 33 is arranged in such a manner that the burr and shear droop of the sheet faces away from the lead frame 25.

Similarly to the first embodiment described above, the whole perimeters of the ends of the insulating sheet 32 and the metal foil 33 are sunken in the sealing resin 31. As a result of this, a structure is achieved in which detachment between the lead frame 25 and the insulating sheet 32, and between the insulating sheet 32 and the metal foil 33, can be suppressed. Moreover, since the burr and droop of the insulating sheet 32 are sunken inside the sealing resin 31, then there is no need to remove same in post processing, thus leading to improved manufacturing efficiency. The thickness of the metal foil 33 is desirably about 100 μm, taking account of processability.

In the second embodiment of the present invention, a sheet in which the insulating sheet 32 and the metal foil 33 are integrated is used, but the present invention is not limited to this. It is also possible to install the metal foil 33 when molding with the sealing resin 31.

As described above, according to the second embodiment, a semiconductor module is formed by also providing a metal foil. As a result of this, it is possible to obtain similar beneficial effects to the first embodiment described above, and it is also possible to protect the insulating sheet from cracks and scratches, etc. by the metal foil.

Third Embodiment

Figure 11:
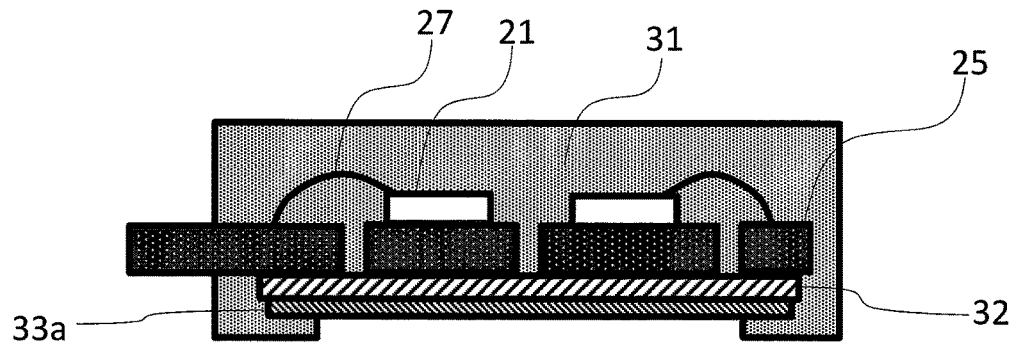
FIG. 11 is a cross-sectional diagram of the semiconductor module according to a third embodiment of the present invention.

Next, a semiconductor module according to a third embodiment will be described below with reference to FIG. 11. FIG. 11 is a cross-sectional diagram of the semiconductor module according to the third embodiment of the present invention.

The semiconductor module of the third embodiment adopts a structure provided with a metal foil 33, similarly to the second embodiment described above, but differs from the second embodiment in that the size of the metal foil 33 is smaller than the size of the insulating sheet 32. Therefore, the planar distance between the lead frame 25 and the metal foil 33 is increased, and hence the insulating performance is improved.

As described above, according to the third embodiment, a semiconductor module is formed by providing a metal foil of a size smaller than the size of the insulating sheet. As a result of this, it is possible to obtain similar beneficial effects to the second embodiment described above, and hence the insulating performance can be further improved.

Fourth Embodiment

Figure 12:
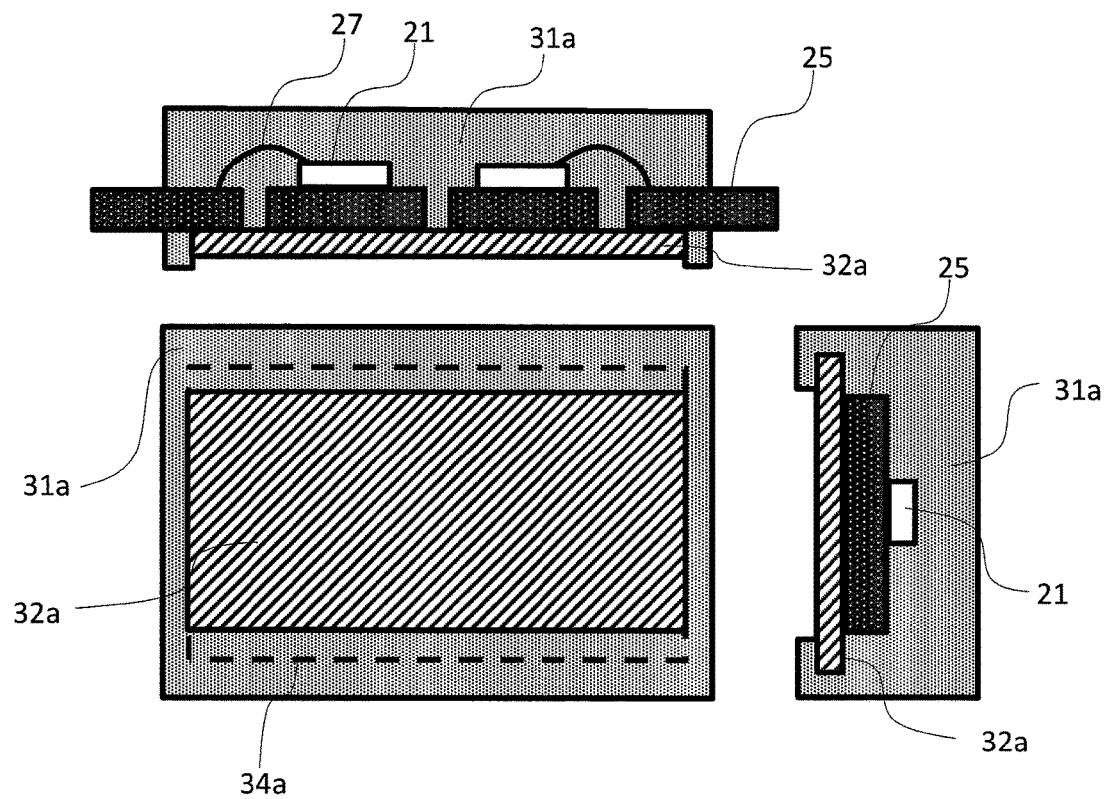
FIG. 12 is a cross-sectional diagram and perspective diagram of the semiconductor module according to a fourth embodiment of the present invention.

Next, a semiconductor module according to a fourth embodiment will be described below with reference to FIG. 12. FIG. 12 is a cross-sectional diagram and perspective diagram of the semiconductor module according to the fourth embodiment of the present invention.

The semiconductor module according to the fourth embodiment, similarly to the first embodiment described above, is not provided with a metal foil 33. The difference with respect to the first embodiment is that the portion of the insulating sheet 32 which is sunken in the sealing resin 31 is two edges only, rather than the whole perimeter. Below, the description centers on the changed portion associated with this difference, and the description of the configuration that is the same as the semiconductor module described above is omitted.

In the fourth embodiment, the insulating sheet 32a is sunken in the sealing resin portion 31a only on two edges, rather than the whole perimeter. Consequently, the surface area of the exposed portion of the insulating sheet 32a is increased in comparison with the semiconductor module of the first embodiment, and the contact surface area with the heat sink 35 can be increased. Accordingly, the thermal resistance of the semiconductor module, in other words, the thermal resistance between the lead frame 25 and the heat sink 35 can be reduced, and consequently, the heat radiating performance can be improved.

Moreover, since the region of the insulating sheet 32a that is exposed is made larger, then the range where electronic components, such as semiconductor elements, can be mounted is also expanded. Consequently, it is possible to achieve both high-density mounting and compactification of the semiconductor module.

As described above, according to the fourth embodiment, a semiconductor module is formed by adopting a structure in which only two edges of the insulating sheet are sunken in the sealing resin, rather than the whole perimeter thereof. As a result of this, it is possible to reduce the thermal resistance of the semiconductor module, as well as enabling high-density mounting and compactification of the module.

Fifth Embodiment

Figure 13:
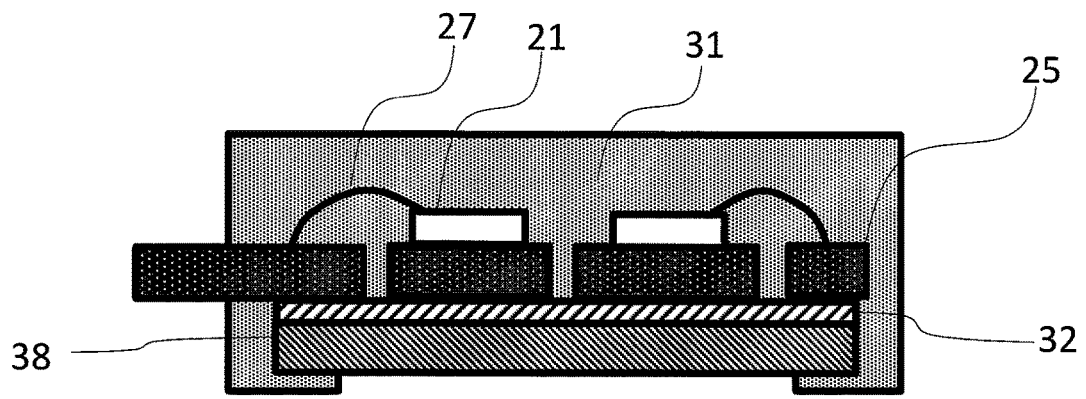
FIG. 13 is a cross-sectional diagram of the semiconductor module according to a fifth embodiment of the present invention.

Next, a semiconductor module according to a fifth embodiment will be described below with reference to FIG. 13. FIG. 13 is a cross-sectional diagram of the semiconductor module according to the fifth embodiment of the present invention.

The semiconductor module according to the fifth embodiment is provided with a metal block 38 in order to increase the heat capacity of the semiconductor module, instead of the metal foil 33 which is incorporated in the second to fourth embodiments described above. Below, the description centers on the changed portion associated with this difference, and the description of the configuration that is the same as the semiconductor module described above is omitted.

The semiconductor module according to the fifth embodiment has increased heat capacity by providing a metal block 38. As a result of this, it is possible to reduce the transient increase in the temperature of the semiconductor module. The thickness of the metal block 38 must be determined in accordance with physical properties, such as the specific heat and density and heat conductivity, of the metal block 38, and the amount of heat generated by the semiconductor module, but the larger the thickness, the greater the beneficial effect obtained.

Figure 14:
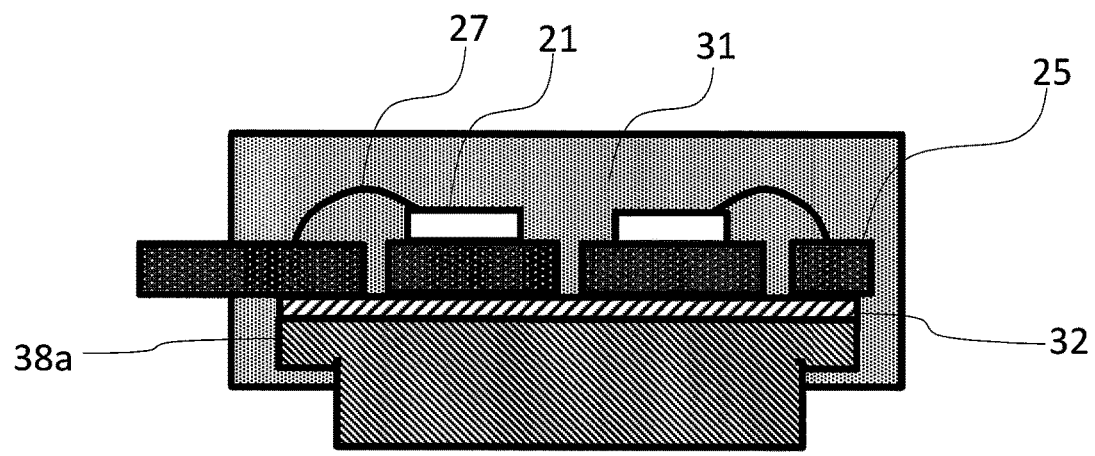
FIG. 14 is a further cross-sectional diagram of the semiconductor module according to the fifth embodiment of the present invention.

Furthermore, FIG. 14 is a further cross-sectional diagram of a semiconductor module according to a fifth embodiment of the present invention, and shows an example of a metal block 38a having a different shape to the metal block 38 illustrated in FIG. 13 above. By integrating with the heat sink in the manner of the metal block 38a illustrated in FIG. 14, it is possible to further reduce the transient increase in temperature.

As described above, according to the fifth embodiment, a semiconductor is formed by adopting a structure which is provided with a metal block, instead of a metal foil. As a result of this, it is possible to increase the heat capacity of the semiconductor module. Moreover, by integrating the metal block with the heat sink, it is possible to achieve a beneficial effect in further reducing the transient increase in temperature.

The invention claimed is:

1. A semiconductor module, comprising:
   a lead frame which is formed of a plurality of terminals and on which electronic components are mounted;
   an insulating sheet arranged in parallel with the lead frame on a rear surface side of the lead frame with respect to a surface where the electronic components are mounted; and
   a resin sealing body which seals the lead frame, the electronic components and the insulating sheet,
   wherein a peripheral portion of the insulating sheet on a rear surface side with respect to a surface in contact with the lead frame is covered by an inwardly extending portion of the resin sealing body, and a central portion of the insulating sheet corresponding to a portion other than the peripheral portion is exposed as a region that is not sealed by the resin sealing body,
   at least one of said plurality of terminals is extended to the outside of the resin sealing body and have a surface above said insulating sheet and in substantially the same plane as a surface of said lead frame in contact with said insulating sheet,
a distance by which said inwardly extending portion extends inwardly beyond an edge of said insulating sheet is greater in a position underlying said at least one terminal than in other positions not underlying said at least one terminal; and
taking a resin width when the resin sealing body seals the peripheral portion to be t2, and for said at least one terminal extended to the outside of the resin body, taking a terminal width of the one terminal included inside the resin sealing body to be t3, the sealing by the resin sealing body is carried out in such a manner that at least one location satisfies the relationship:

t3>t2.

2. The semiconductor module according to claim 1, wherein the insulating sheet has a metal member corresponding to a metal foil or metal block on the rear surface side with respect to the surface in contact with the lead frame, the metal member being of a size equal to or smaller than the size of the insulating sheet and being arranged in parallel with the lead frame,
the resin sealing body seals the lead frame, the electronic components and the insulating sheet having the metal member, and
at least a portion of a peripheral portion of the insulating sheet on the rear surface side having the metal member is covered by said inwardly extending portion of the resin sealing body, and in said central portion of the insulating sheet, the metal member is exposed in said region that is not sealed by the resin sealing body.

3. The semiconductor module according to claim 2, wherein, taking a resin height in said inwardly extending portion to be t1, the sealing by the resin sealing body is carried out so as to satisfy the relationship:

t2>t1.

4. The semiconductor module according to claim 2, wherein the electronic components are arranged on the lead frame within a range corresponding to the portion exposed as the region that is not sealed by the resin sealing body.

5. The semiconductor module according to claim 1, wherein, taking a resin height in said inwardly extending portion to be t1, the sealing by the resin sealing body is carried out so as to satisfy the relationship:

t2>t1.

6. The semiconductor module according to claim 1, wherein the electronic components are arranged on the lead frame within a range corresponding to the portion exposed as the region that is not sealed by the resin sealing body.

7. A drive device equipped with a semiconductor module, the drive device comprising:
the semiconductor module according to claim 1; and
a heat sink on which the semiconductor module is mounted, the heat sink being positioned so as to contact the region that is not sealed by the resin sealing body.

8. The drive device equipped with a semiconductor module according to claim 7, further comprising a frame structure which presses the semiconductor module towards the heat sink from above the semiconductor module.

9. A semiconductor module, comprising:
a lead frame which is formed of a plurality of terminals and on which electronic components are mounted;
an insulating sheet arranged in parallel with the lead frame on a rear surface side of the lead frame with respect to a surface where the electronic components are mounted; and
a resin sealing body which seals the lead frame, the electronic components and the insulating sheet,
wherein a peripheral portion of the insulating sheet on a rear surface side with respect to a surface in contact with the lead frame is covered by an inwardly extending portion of the resin sealing body, and a central portion of the insulating sheet corresponding to a portion other than the peripheral portion is exposed as a region that is not sealed by the resin sealing body,
at least one of said plurality of terminals is extended to the outside of the resin sealing body,
a distance by which said inwardly extending portion extends inwardly beyond an edge of said insulating sheet is greater in a position underlying said at least one terminal than in other positions not underlying said at least one terminal; and
taking a resin width when the resin sealing body seals the peripheral portion to be t2, and for said at least one of said terminals extended to the outside of the resin body, taking a terminal width of the one terminal included inside the resin sealing body to be t3, the sealing by the resin sealing body is carried out in such a manner that at least one location satisfies the relationship:

t3>t2.

10. A semiconductor module, comprising:
a lead frame which is formed of a plurality of terminals and on which electronic components are mounted;
an insulating sheet arranged in parallel with the lead frame on a rear surface side of the lead frame with respect to a surface where the electronic components are mounted; and
a resin sealing body which seals the lead frame, the electronic components and the insulating sheet,
wherein a peripheral portion of the insulating sheet on a rear surface side with respect to a surface in contact with the lead frame is covered by an inwardly extending portion of the resin sealing body, and a central portion of the insulating sheet corresponding to a portion other than the peripheral portion is exposed as a region that is not sealed by the resin sealing body,
at last one of said plurality of terminals is extended to the outside of the resin sealing body,
a distance by which said inwardly extending portion extends inwardly beyond an edge of said insulating sheet is greater in a position underlying said at least one terminal than in other positions not underlying said at least one terminal;
wherein the insulating sheet has a metal member corresponding to a metal foil or metal block on the rear surface side with respect to the surface in contact with the lead frame, the metal member being of a size equal to or smaller than the size of the insulating sheet and being arranged in parallel with the lead frame,
the resin sealing body seals the lead frame, the electronic components and the insulating sheet having the metal member,
at least a portion of a peripheral portion of the insulating sheet on the rear surface side having the metal member is covered by said inwardly extending portion of the resin sealing body, and in said central portion of the insulating sheet, the metal member is exposed in said region that is not sealed by the resin sealing body; and taking a resin width when the resin sealing body seals the peripheral portion to be t2, and for one of said terminals extended to the outside of the resin body, taking a terminal width of the one terminal included inside the resin sealing body to be t3, the sealing by the resin sealing body is carried out in such a manner that at least one location satisfies the relationship:

t3>t2.

* * * * *